United States Patent
Engel et al.

(10) Patent No.: US 9,608,157 B2
(45) Date of Patent: Mar. 28, 2017

(54) PHOTON COUNTING SEMICONDUCTOR DETECTORS

(71) Applicant: KONINKLIJKE PHILIPS N.V., Eindhoven (NL)

(72) Inventors: Klaus Juergen Engel, Veldhoven (NL); Christoph Herrmann, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/422,100

(22) PCT Filed: Aug. 12, 2013

(86) PCT No.: PCT/IB2013/056578
§ 371 (c)(1),
(2) Date: Feb. 17, 2015

(87) PCT Pub. No.: WO2014/030094
PCT Pub. Date: Feb. 27, 2014

(65) Prior Publication Data
US 2015/0228838 A1  Aug. 13, 2015

Related U.S. Application Data

(60) Provisional application No. 61/692,417, filed on Aug. 23, 2012.

(51) Int. Cl.
H01L 31/115 (2006.01)
H01L 27/146 (2006.01)
(Continued)

(52) U.S. Cl.
CPC ............ *H01L 31/115* (2013.01); *G01T 1/241* (2013.01); *H01L 27/14676* (2013.01); *H01L 31/022408* (2013.01); *H01L 31/18* (2013.01)

(58) Field of Classification Search
CPC ............... G01T 1/241; H01L 27/14676; H01L 31/022408
See application file for complete search history.

(56) References Cited

U.S. PATENT DOCUMENTS 3,702,790 A * 11/1972 Nakanuma ............ H01L 21/763
148/DIG. 122
5,677,539 A  10/1997 Apotovsky et al.
(Continued)

FOREIGN PATENT DOCUMENTS

| JP | 08-204182 | * | 9/1996 |
| WO | 9714060 A1 | | 4/1997 |
| WO | 2010073189 A1 | | 7/2010 |

OTHER PUBLICATIONS

Machine English translation of JP08-204182.*
(Continued)

*Primary Examiner* — David Porta
*Assistant Examiner* — Mindy Vu

(57) ABSTRACT

A radiation detector (10) includes a semiconductor element (1) for generating positive holes and electrons, a cathode (2) formed on a first surface of the semiconductor element (1) and a plurality of segmented anodes (3) formed on a second surface of the semiconductor element (1), the second surface being in opposed relation to the first surface. Additionally, a plurality of segmented steering electrodes (5a) are positioned adjacent the plurality of segmented anodes (3). Moreover, a plurality of doping atoms are located above at least a portion of the plurality of segmented anodes (3) for reducing the voltage difference between the plurality of segmented anodes (3) and the plurality of segmented steering electrodes (5a).

19 Claims, 3 Drawing Sheets

(51) Int. Cl.
   *G01T 1/24*      (2006.01)
   *H01L 31/0224*   (2006.01)
   *H01L 31/18*     (2006.01)

(56) References Cited

U.S. PATENT DOCUMENTS

| | | |
|---|---|---|
| 5,821,539 A | 10/1998 | Matz et al. |
| 6,002,134 A | 12/1999 | Lingren |
| 6,333,504 B1 | 12/2001 | Lingren et al. |
| 6,344,650 B1 | 2/2002 | Lee et al. |
| 6,455,858 B1 | 9/2002 | Patt et al. |
| 6,541,836 B2 | 4/2003 | Iwanczyk et al. |
| 7,315,025 B2 | 1/2008 | Yokoi et al. |
| 8,067,744 B2 | 11/2011 | Blevis et al. |
| 2012/0068078 A1 | 3/2012 | Zhang et al. |

OTHER PUBLICATIONS

Matteson et al: "Charge Collection Studies Ofa High Resolution CZT-Based Detector for Pet"; 2008 IEEE Nuclear Science Symposium Conference Record, R17-8, pp. 503-510.

Eskin et al: "Signals Induced in Semiconductor Gamma-Ray Imaging Detectors"; Journal of Applied Physics. vol. 85, No. 2, Jan. 15, 1999, pp. 647-659.

* cited by examiner

PHOTON COUNTING SEMICONDUCTOR DETECTORS

CROSS-REFERENCE TO PRIOR APPLICATIONS

This application is the U.S. National Phase application under 35 U.S.C. §371 of International Application No. PCT/IB2013/056578 filed on Aug. 12, 2013, which claims the benefit of U.S. Provisional Patent Application No. 61/692,417, filed on Aug. 23, 2012. These applications are hereby incorporated by reference in their entirety herein.

The present application generally relates to X-ray photon counting detectors. While it is described with particular application to computed tomography (CT), it also relates to other applications in which it is desirable to energy-resolve detected photons having different energies.

A computed tomography (CT) system includes a radiation source that emits poly-energetic ionizing photons that traverse an examination region. Such a system also includes a radiation sensitive detector, located opposite the examination region from the radiation source that detects the photons that traverse the examination region. The detector produces an electrical signal, such as a current or voltage, for each detected photon. The detector further includes electronics for energy-resolving the detected photons based on the electrical signals.

A direct conversion photon counting detector includes a block of semiconductor material between two electrodes, to which a high voltage is applied. An incident photon creates a number of electron/hole pairs. The charges are separated in the electric field, i.e., electrons are drifting towards an (eventually segmented) anode, and holes are drifting towards an (eventually segmented) cathode. For example, the detector can be sensitive to X-ray photons, gamma ray photons, or optical photons. The detector could, for example, include CdTe or CZT dedicated for X-ray photon counting. The photons can, for example, be incident through the cathode, and electrons can be collected by a segmented (i.e., pixelated) anode. In general, the number of charges is proportional to the original photon energy. Beside the pure detection of an absorbed photon, it is possible to measure the total collected charge to determine the original photon energy.

During the drift of the charges, a current is induced into any electrode due to a capacitive coupling. A current pulse, $I_j(t)$, generated in a pixel, j, by a charge carrier having a charge, q, and a trajectory, $\vec{r}(t)$, across the direct converter is calculated analytically by the formula: $I_j(t) = q \cdot \nabla \phi_j(\vec{r}(t)) \cdot \dot{\vec{r}}(t)$, wherein $\nabla \phi_j(\vec{r}(t))$ represents the gradient of the weighting potential (also known as weighting field) of the j-th electrode (or pixel) at the charge position $\vec{r}(t)$, and $\dot{\vec{r}}(t)$ represents the velocity vector of the charge. Simply put, the current induced to an electrode is greater, the greater the weighting potential gradient of the corresponding electrode is, and the faster the charge moves.

To enable fast counting performance, it is a requirement to generate pulses as short as possible. Typically, it is aimed to reduce the size of the signal generating electrodes, as a smaller size enables a confinement of the weighting potential around the electrode, i.e., the weighting potential gradient is locally enhanced. In practice, a rectangular or hexagonal pixel array is chosen, where each pixel generates a sharpened pulse due to the effect which is known as small pixel effect.

Therefore, the main part of the pulse is induced just before the drifting charges enter a pixel electrode, which results in severely sharpened pulses compared to a continuous layer electrode. The pixel periodicity, however, cannot be reduced without accepting a major degradation effect known as charge sharing, as with decreasing pixel size the probability increases that a charge cloud is partly collected by neighbouring pixels, therefore generating counts in each of the pixels. In the case that the pulse is used for a photon energy measurement, it happens that only a part of the charge is collected by each pixel such that the original energy information is lost.

A further pulse sharpening is possible with the concept of steering electrodes. In this concept, the pixel pitch is conserved, but the size of a collecting pixel electrode is further reduced such that it provides an even better confined weighting potential. The collecting electrodes are surrounded by a so-called steering electrode, which fills, as best as possible, the gaps between the collecting pixel electrodes. To avoid charges being collected by the steering electrode, it is usually set on an electrical potential of same polarity as the charges. For adequate potential differences, the electric field within the semiconductor is bended such that the charges are guided essentially towards the collecting electrodes. This concept can be improved by using not only one but several staggered steering electrodes.

Aspects of the present application address the above-referenced matters and others.

According to one aspect, an apparatus includes a pair of collecting electrodes in opposed relation to each other, a semiconductor placed between the pair of collecting electrodes, and a steering electrode positioned adjacent one of the pair of collecting electrodes. Additionally, a spatially modulated doping profile is located above at least a portion of the steering electrode and within the semiconductor.

In another aspect, a radiation detector includes a semiconductor element for generating holes and electrons, a cathode formed on a first surface of the semiconductor element, and a plurality of segmented anodes formed on a second surface of the semiconductor element, the second surface being in opposed relation to the first surface. The radiation detector further includes at least one steering electrode positioned adjacent the plurality of anodes and a plurality of doping atoms created above at least a portion of the at least one steering electrode and within the semiconductor element. In another aspect, a method includes providing a pair of collecting electrodes in opposed relation to each other, placing a semiconductor between the pair of collecting electrodes, positioning a steering electrode adjacent one of the pair of collecting electrodes and creating an isolation region directly above at least a portion of the steering electrode, such that a spatially modulated doping profile including a plurality of doping atoms is located above said isolation region and within the semiconductor.

Still further aspects of the present invention will be appreciated to those of ordinary skill in the art upon reading and understanding the following detailed description.

The invention may take form in various components and arrangements of components, and in various steps and arrangements of steps. The drawings are only for purposes of illustrating the preferred embodiments and are not to be construed as limiting the invention.

In present concepts of steering electrodes, a voltage has to be applied between the collecting electrode and the steering electrode, which causes offset currents injected by the steering electrode and/or by the collecting electrode. Furthermore, the fact that two different voltages have to be applied to electrodes close to each other increases technological complexity, for example, in terms of electrical insulation of the electrodes from each other, as well as providing of a relatively high voltage (e.g., 50-200V) on the bonding substrate.

The supply of a relatively high voltage to the steering electrode is avoided by using a spatially modulated doping profile within the detector crystal. The doping is essentially located above the surface of the steering electrodes, which are put on the same or similar potential as the collecting anodes. At room temperature, the doping atoms release, dependent on their type, either a hole or an electron, such that an ion remains fixed within the crystal structure. If an external electric field exists, the released charges are removed and collected by the external electrodes such that the remaining ions create a background charge, which modifies the electric field. The position and type of the ionized doping atoms is chosen such that the resulting electric field is modified in an equivalent way as would be the case for a steering electrode put on a relatively high voltage.

Figure 1:
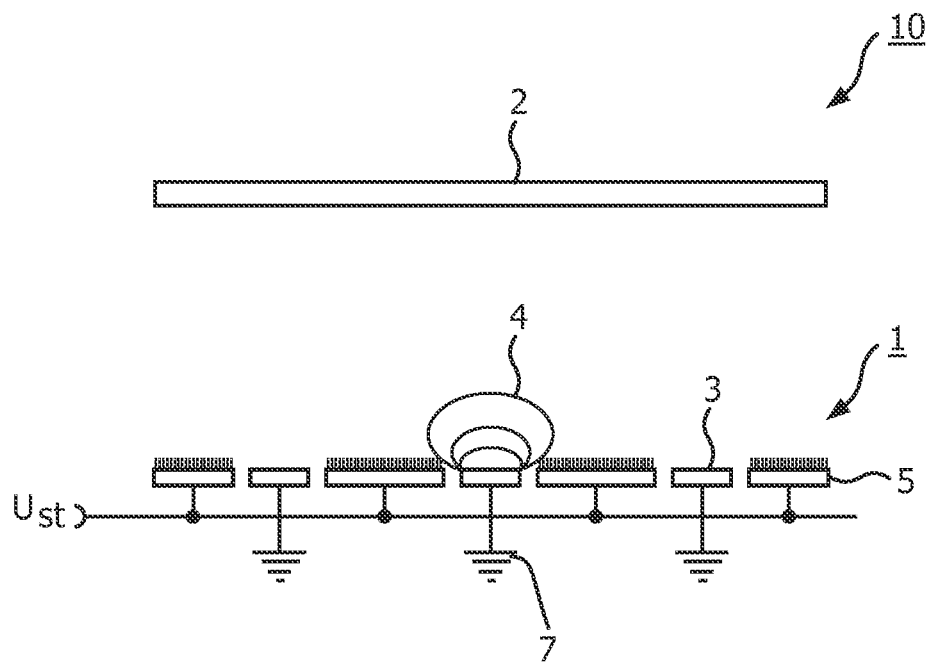
FIG. 1 illustrates an example of a semiconductor detector equipped with steering electrodes.
Figure 2:
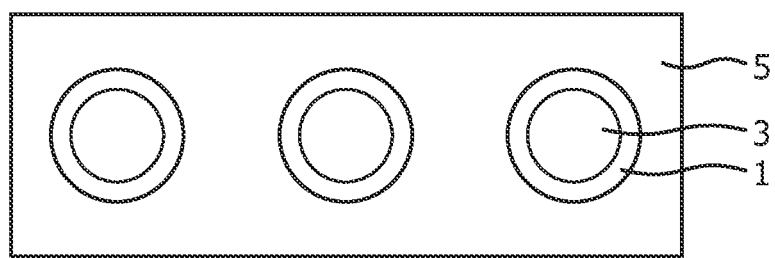
FIG. 2 illustrates an example of a side view of the semiconductor detector of FIG. 1 depicting the anode surface plane.

The geometry of steering electrodes is demonstrated in FIGS. 1 and 2. In FIG. 1, the detector essentially consists of a slice of a semiconducting material 1. The semiconductor crystal 1 is a slab or wafer of high-resistivity, high impedance semiconductor material. Preferably, the semiconductor crystal 1 consists of a slab of high-resistivity CdZnTe, which can operate at room temperature and can be fabricated into detectors. Alternatively, the semiconductor crystal 1 may be formed from CdTe, $HgI_2$, PbI, or other semiconductor materials that have high-resistivity and that can be fabricated into detectors. Of course, those skilled in the art will recognize that virtually any semiconductor material may be used in the invention.

In the instant case, a geometry having the cathode 2 on the "top" surface through which photons are incident, has been selected as an example. The opposite surface is segmented by collecting anode pixels 3, characterized by a confined weighting potential 4, which are typically surrounded by an at least one steering electrode 5a. Often the collecting anode pixels 3 are circularly shaped, as indicated in FIG. 2, typically having an area being small compared to an area 5 having steering electrodes 5a (shown in FIGS. 3 and 4).

The steering electrodes 5a may be formed on or in the semiconductor crystal 1 using a variety of techniques. Preferably, the electrodes are gold films, commonly used in CdZnTe detector manufacture, electrochemically deposited on the surface of the semiconductor crystal 1. Alternatively, other conducting materials, including platinum, rhodium, and other metals, can be electrochemically deposited on the crystal surface to form the electrodes. Those skilled in the art will recognize that other conductors may be used for the electrodes. As an alternative to electrochemical deposition, the electrode material may be deposited on the crystal via evaporation, sputtering, or surface alloying. The electrodes may be formed by other techniques as well, such as ion beam deposition and chemical vapor deposition of conductive materials. The electrodes may be formed in a variety of configurations, including mesa, trenched, and buried configurations.

Figure 4:
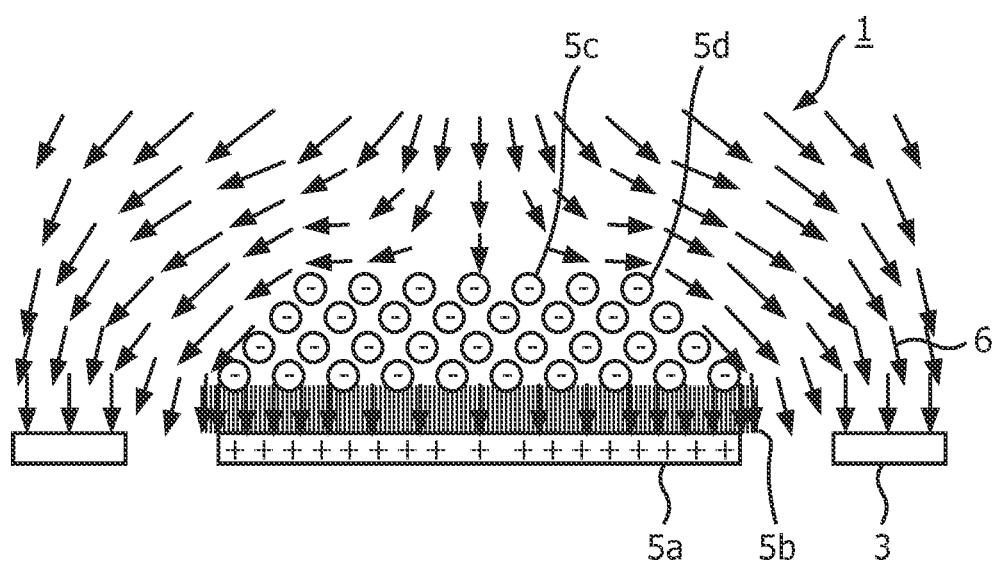
FIG. 4 illustrates an example of a steering electrode, separated from the semiconductor crystal by an isolation layer and having a spatially doped region abovewith a bias voltage applied between the cathode and the anode.

In common steering electrode detectors, the steering electrode 5a is set to a negative electric potential compared to the anode pixels 3, which are typically grounded 7. In this configuration, the electric field lines 6 are bent such that they essentially end on an anode pixel 3, as shown in FIG. 4. In other words, the electrons (almost following the path of the electric field lines) are repelled by the negatively charged steering electrode 5a and are attracted by the more positively charged (with respect to the cathode 2 and the steering electrode 5a) anode pixels 3.

Figure 3:
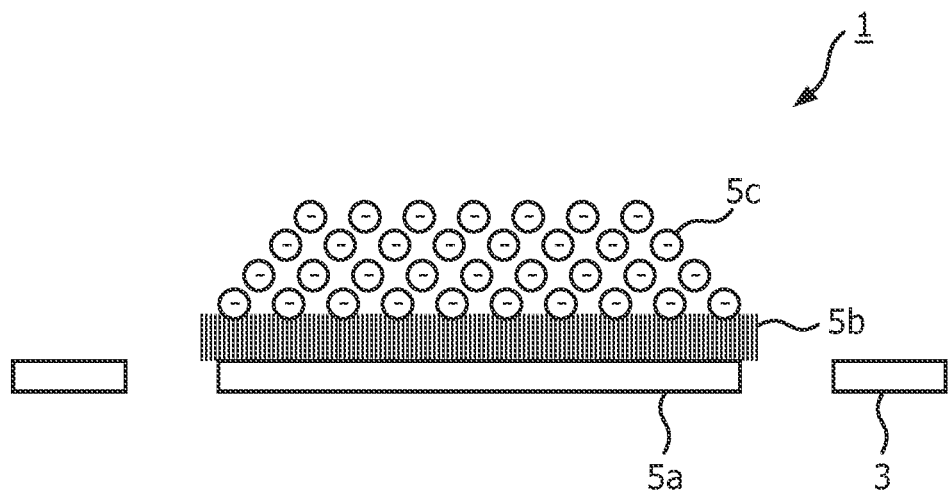
FIG. 3 illustrates an example of a steering electrode, separated from the semiconductor crystal by an isolation layer and having a spatially doped region above.

Thus, the negative charge on the steering electrode 5a is replaced by a negative charge in a region 5d above the steering electrode 5a, while the steering electrode 5a can be set on an almost neutral electric potential very similar to that of the anode pixels 3. This can be done by the introduction of doping atoms above the steering electrode, as shown in FIG. 3. There are several techniques that can be conceived by one skilled in the art, for example, by evaporating the dopant material onto a mask provided that only the steering electrode areas are covered by the doping material, and a successive heating of the semiconductor to allow a local in-depth diffusion of the doping material. Another method could be the implantation of dopants with the help of a scanning ion beam. A third method could be the evaporation of adequately doped semiconductor material through a mask attached to the original crystal, such that only the steering electrode areas are covered.

In the exemplary embodiments of the present disclosure, a p-type doping is used. In other words, acceptor atoms are used, which are each able to release a hole, respectively, and become negatively charged ions fixed within the crystal matrix.

Referring to FIGS. 3 and 4, assuming that a doping profile is established, a self-organizing ionization process happens as soon as a bias voltage is applied between cathode 2 and anode pixels 3 (assuming that the steering electrode 5a is set on the same electric potential as the anode pixels 3). As long as an electric field exists within a particular part of the doped region, free holes are removed from the region by the electric field, such that a region of negatively charged ions remains (a process known as depletion within semiconductors). The depletion "grows" into the doped region as long as the background charge of the ions is not yet large enough to generate a polarization field which compensates the original field.

The exemplary embodiments of the present disclosure may be distinguished between two static cases. In the first case, the doped region is partially negatively charged 5c such that the resulting polarization field compensates the externally applied electrical field in a part 5d within the doped region, such that these regions are free of an electric field (i.e., not depleted). In this case the electric field lines do not traverse this region 5d but are bent around. With an adequate doping concentration, it is possible to generate an electric field, which is similar to that created by a commonly charged steering electrode 5a, i.e., the field lines are bent such that they essentially end on the anodes 3. This case can be considered as static equilibrium even under irradiation conditions, as electrons approaching from the bulk crystal are guided around the region 5d, while they are not trapped by the negatively charged ions in the depleted region. On the other hand, the concentration of holes induced by radiation can be considered as negligible near the anodes, as well as it can be assumed that there is only a negligible amount of holes injected by the electrodes.

In the second case, the doped region is fully depleted. In this case, by definition, electric field lines can traverse the region $5c$ such that some field lines may end on the steering electrode. To avoid electron collection by the steering electrode, a negative voltage is applied to the steering electrode as is the case in the "classical" method without doped region $5c$. However, as the doped region already aids in bending the field lines, a lower potential difference between steering electrode $5a$ and anode $3$ already satisfies the bending of all field lines to the anodes $3$.

Finally it is noted that the charged region $5c$ capacitively induces a positive charge on the steering electrode $5a$, even if it set on ground potential. The case can be considered by classical electrostatics as a dipole comparable to the field created by a plate capacitor. "Outside," the capacitor's electric field is directed opposite to that of the externally applied field. On the other hand, while it is "inside," the capacitor's electric field is directed such that in a region between the depleted region $5c$ and the electrode $5a$, the field is strengthened. It is therefore recommended to place an insulation (or isolation) layer $5b$ above the steering electrode $5a$ to avoid the injection of holes into the crystal bulk. Of course, the insulation layer $5b$ is optional. Otherwise, the injected holes can be trapped by the ionized doping atoms, making them electrically neutral. This can potentially cause time-dependent polarization effects, which are disadvantageous for the stability of the system.

Figure 5:
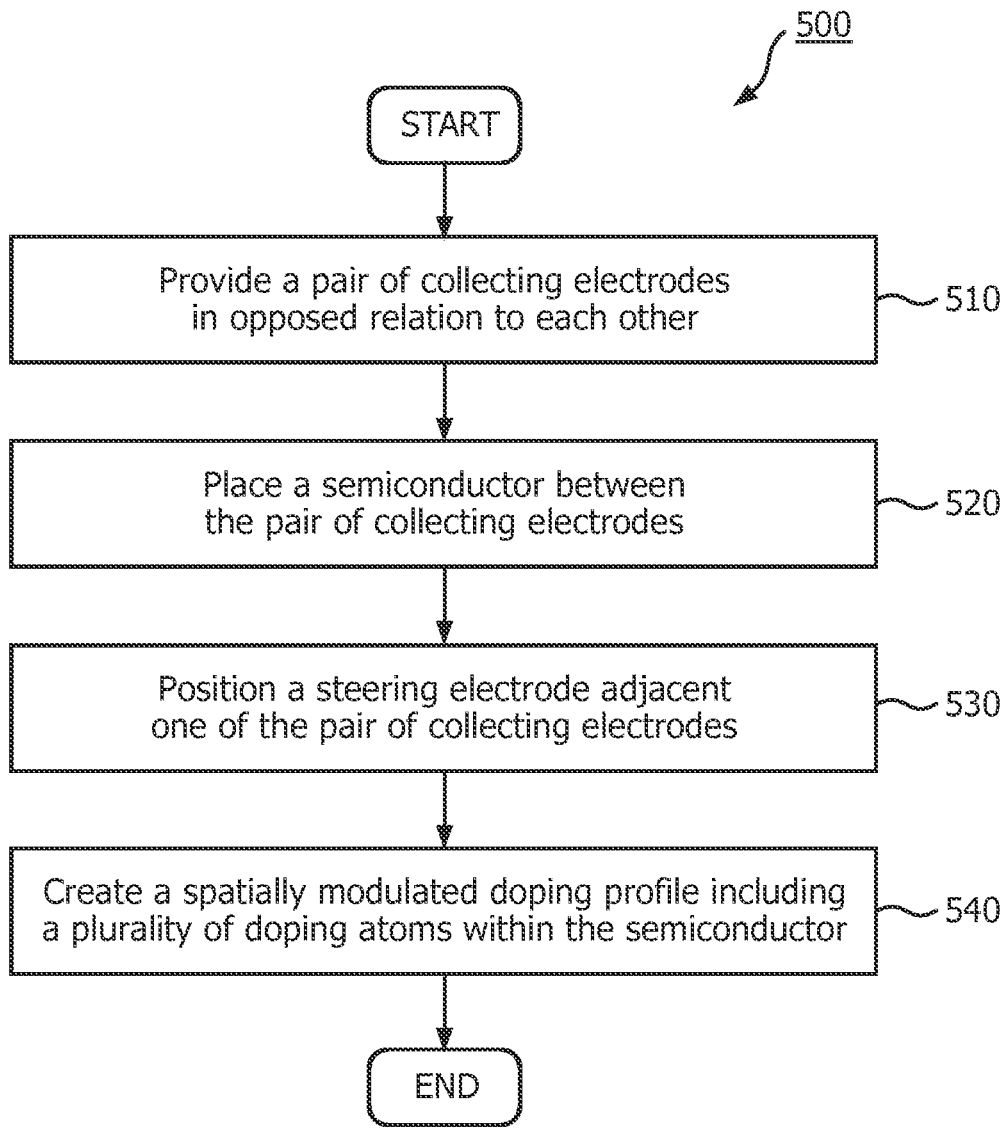
FIG. 5 illustrates a flowchart for charge cloud guiding in photon counting semiconductor devices.

Referring to FIG. 5, a flowchart 500 for charge cloud guiding in photon counting semiconductor devices is presented. In step 510, a pair of collecting electrodes are provided in opposed relation to each other. In step 520, a semiconductor is placed between the pair of collecting electrodes. In step 530, a steering electrode is positioned adjacent one of the pair of collecting electrodes. In step 540, a spatially modulated doping profile is created including a plurality of doping atoms within the semiconductor. The process then ends for the first iteration.

It is to be appreciated that the embodiments described above may be used individually or in combination.

Applications include luggage inspection, non-destructive testing, medical digital fluoroscopy, mammography, x-ray, as well as other industrial and medical applications. Applications further include all kinds of photon counting detectors (for energies in the range between optical and gamma-ray, from about 1 eV up to several MeV) designed for high count rates, i.e., detectors for use in medical imaging applications, such as, for example, Spectral X-ray or Spectral CT, in industrial imaging, for example, in applications for quality assurance, in homeland security, for example, for baggage scanning, or in astronomical and other detectors for scientific purposes.

The principles of the invention are also applicable to other types of detectors, such as liquid ionization detectors and gas ionization detectors. Semiconductor radiation detectors of the type described above are just one member of a class of radiation detectors known as ionization detectors. In such detectors, radiation is absorbed in an appropriate radiation interaction material to produce mobile electric charges which are collected by electrodes, thereby producing electrical output signals. In addition to semiconductor materials, the radiation interaction material may be a solid insulator (which can be considered as semiconductors with very wide bandgaps), a liquid, or a gas. It is noted that in such liquid and gas ionization detectors dopant atoms should preferably be fixed to create an electric field.

Liquid and gas ionization detectors (also known as ionization gauges) have been commercially available for many years and are widely used in nuclear technology. Such detectors essentially comprise an enclosed liquid or gaseous substance and two electrodes, the cathode and anode. Gamma rays or x-rays absorbed in the gas produce electrons and positive ions which, when a bias voltage is applied, sweep to the anode and cathode, respectively. Thus, while conceptually analogous to a semiconductor radiation detector, a central difference is that positive charge is carried by positive ions instead of holes.

The methods described herein may be implemented via one or more processors executing one or more computer readable instructions encoded or embodied on computer readable storage mediums, such as physical memory, which causes the one or more processors to carry out the various acts and/or other functions. The one or more processors can also execute instructions carried by transitory mediums, such as a signal or carrier wave.

While several components have been disclosed and shown separately in order to ease an understanding of the invention, it should be appreciated, that due to being able to integrate electrical/electronic components, two or more components can also be combined into one component comprising the functionality/features of these two or more components.

The mere fact that certain measures are recited in mutually different dependent claims does not indicate that a combination of these measures cannot be used to advantage. Any reference signs in the claims should not be construed as limiting the scope.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An apparatus, comprising:
   a pair of collecting electrodes in opposed relation to each other, wherein a first of the pair of electrodes is configured to receive X-ray photons;
   a voltage source across the pair of collecting electrodes;
   a semiconductor placed between the pair of collecting electrodes which creates one or more electron/hole pairs in response to an X-ray photon incident on the first of the pair of electrodes;
   a steering electrode positioned adjacent second of the pair of collecting electrodes and configured to steer electrons to the second of the pair of collecting electrodes; and
   a doped region of the semiconductor having a spatially modulated doping profile and located above at least a portion of the steering electrode and within the semiconductor, wherein the doped region is in a side of the semiconductor next to the steering electrode and the second of the pair of collecting electrodes, adjacent to the steering electrode, wherein the doped region generates an electric field that steers charge in the semiconductor towards the second of the pair of collecting electrodes.

2. The apparatus of claim 1, wherein a first collecting electrode of the pair of collecting electrodes is a cathode and a second collecting electrode of the pair of collecting electrodes is an anode.

3. The apparatus of claim 1, wherein the steering electrode is a plurality of electrodes positioned adjacent the second collecting electrode.

4. The apparatus of claim 1, wherein the doping profile includes a plurality of doping atoms of at least one doping material.

5. The apparatus of claim 1, wherein the plurality of doping atoms are implanted via a scanning ion beam; wherein the plurality of doping atoms are generated via evaporation through a mask previously attached to the semiconductor, such that only steering electrode areas are covered; or wherein the plurality of doping atoms are implanted via evaporation onto a mask previously attached to the semiconductor, such that only steering electrode areas are covered and followed by subsequent heating of the semiconductor to allow for a local in-depth diffusion of the plurality of doping atoms.

6. The apparatus of claim 1, wherein the spatially modulated doping profile allows for a reduction in a voltage difference applied between the second collecting electrode and the steering electrode, placed adjacent to each other.

7. The apparatus of claim 1, wherein externally applied electric potentials to a second collecting electrode of the pair of collecting electrodes and to the steering electrode are substantially the same.

8. The apparatus of claim 1, wherein a first electric potential applied to the steering electrode is negative relative to the second electrical potential applied to the second collecting electrode of the pair of collecting electrodes.

9. The apparatus of claim 1, wherein the doped region is partially negatively charged.

10. The apparatus of claim 1, wherein the doped region is free of an electric field and not depleted.

11. The apparatus of claim 1, wherein the doped region is fully depleted.

12. A radiation detector, comprising:
   a semiconductor element for generating positive holes and electrons;
   a cathode formed on a first surface of the semiconductor element, wherein the cathode is configured to receive X-ray photons;
   a plurality of segmented anodes formed on a second surface of the semiconductor element, the second surface being in opposed relation to the first surface;
   a voltage source across the cathode and the plurality of anodes;
   wherein the semiconductor generates one or more electron/hole pairs in response to an X-ray photon incident on the cathode;
   at least one steering electrode positioned adjacent the plurality of segmented anodes and configured to steer electrons to at least one of the plurality of segmented anodes; and
   a plurality of doping atoms located above at least a portion of the steering electrode and within the semiconductor element, the plurality of doping atoms having a spatially modulated doping profile, wherein the plurality of doping atoms is in a side of the semiconductor element next to the steering electrode and the plurality of segmented anodes, adjacent to the steering electrode, wherein the plurality of doping atoms generates an electric field that steers charge in the semiconductor element towards the plurality of segmented anodes.

13. The radiation detector of claim 12, wherein the plurality of doping atoms are implanted via a scanning ion beam.

14. The radiation detector of claim 12, wherein the plurality of doping atoms are generated via evaporation through a mask previously attached to the semiconductor, such that only steering electrode areas are covered; wherein the plurality of doping atoms are implanted via evaporation onto a mask previously attached to the semiconductor, such that only steering electrode areas are covered and followed by subsequent heating of the semiconductor to allow for a local in-depth diffusion of the plurality of doping atoms; or wherein the spatially modulated doping profile allows for a reduction in a voltage difference applied between the second collecting electrode and the steering electrode, placed adjacent to each other.

15. The radiation detector of claim 12, wherein externally applied electric potentials to the plurality of segmented anodes and to the steering electrode are substantially the same.

16. The radiation detector of claim 12, wherein the spatially modulated doping profile is separated from the steering electrode by an electrically insulating region.

17. A method, comprising:
   providing a pair of collecting electrodes in opposed relation to each other, wherein a first of the pair of electrodes is configured to receive X-ray photons;
   placing a semiconductor between the pair of collecting electrodes;
   applying an electric potential across the pair of collecting electrodes, which causes the semiconductor to create one or more electron/hole pairs in response to an X-ray photon incident on the first of the pair of electrodes
   positioning a steering electrode adjacent one of the pair of collecting electrodes which causes the steering electrode to steer electrons to the one of the pair of collecting electrodes; and
   creating a spatially modulated doping profile including a plurality of doping atoms within the semiconductor in a side of the semiconductor next to the steering electrode and the one of the pair of collecting electrodes, and adjacent to the steering electrode, wherein the plurality of doping atoms generates an electric field that steers charge in the semiconductor towards the one of the pair of collecting electrodes.

18. The method according to claim 17, further including implanting the doping atoms via a scanning ion beam, or implanting the doping atoms via evaporation through a mask previously attached to the semiconductor, such that only steering electrode areas are covered.

19. The method according to claim 17, further including allowing for a reduction in a voltage difference applied between a second collecting electrode of the pair of collecting electrodes and the steering electrode, placed adjacent to each other, via the plurality of doping atoms of the isolation region.

* * * * *